Sept. 26, 1967 H. G. DILL 3,344,322

METAL-OXIDE-SEMICONDUCTOR FIELD EFFECT TRANSISTOR

Filed Jan. 22, 1965 2 Sheets-Sheet 1

Hans G. Dill,
INVENTOR.
BY.
John M. Koch

ATTORNEY.

METAL-OXIDE-SEMICONDUCTOR FIELD EFFECT TRANSISTOR

Filed Jan. 22. 1965 2 Sheets-Sheet 2

Hans G. Dill,
INVENTOR.

BY.
John M. Koch
ATTORNEY.

United States Patent Office 3,344,322
Patented Sept. 26, 1967

3,344,322

METAL-OXIDE-SEMICONDUCTOR FIELD EFFECT TRANSISTOR

Hans G. Dill, Costa Mesa, Calif., assignor to Hughes Aircraft Company, Culver City, Calif., a corporation of Delaware Filed Jan. 22, 1965, Ser. No. 427,299
5 Claims. (Cl. 317—235)

ABSTRACT OF THE DISCLOSURE

A metal-oxide-semiconductor field effect transistor employing a channel area located on a mesa relative to the source and drain areas.

Metal-oxide-semiconductor field effect transistors show great promise for applications in the electronics industry because of their pentode characteristics and their use of an insulated gate with a high input impedance permitting direct current coupling between multiple transistor stages. A considerable amount of research and development effort is being directed toward the solution of noise and stability problems which are created by surface conditions, especially in the gate region of these field effect transistors. In addition to these problems, it is necessary to simplify the fabrication processes for these field effect transistors so that they can compete successfully with equivalent prior art devices such as vacuum tubes and bipolar transistors. One of the primary fabrication problems encountered in producing these transistors is that of precise location of the metal gate film relative to the channel region in the fabricated structure. If the metal gate film is too wide relative to the channel region in the transistor, additional stray capacitance is developed which reduces the frequency response of the transistor. On the other hand, if the metal gate film is too small relative to the channel region in the transistor, and does not cover the entire channel area, additional ohmic losses are introduced into the transistor and low transconductance may result.

Accordingly, it is a primary object of this invention to solve the fabrication problems encountered in the production of these field effect transistors by placing the metal film gate over the channel area of the transistor in such a manner that the source and drain areas are overlapped by the amount equal to the diffusion depth.

An arrangement of this type in these transistors is characterized by having a moderate frequency response and certain stability problems as a voltage amplifier (Miller effect) but the power capabilities thereof are excellent. Transistors of this type are useful as final power amplifiers having little voltage gain. They operate up to 10 megacycles and have power dissipation in the watt range.

The metal-oxide-semiconductor field effect transistor operates upon the same principle as the junction field effect transistor. It uses a gate electrode separated by an insulator rather than the depletion layer of a reverse-biased junction. A more detailed description of specific embodiments of the invention is given below with reference to the appended drawings, wherein.

The fabrication steps involved for the production of the specific embodiment of the transistor of the invention shown in FIG. 5 will be given with reference to FIGS. 1 to 4 to show the novel structure thereof. FIGS. 1 to 4 and 6 are considered to be sections taken as along line 6—6 of FIG. 5.

Figure 1:
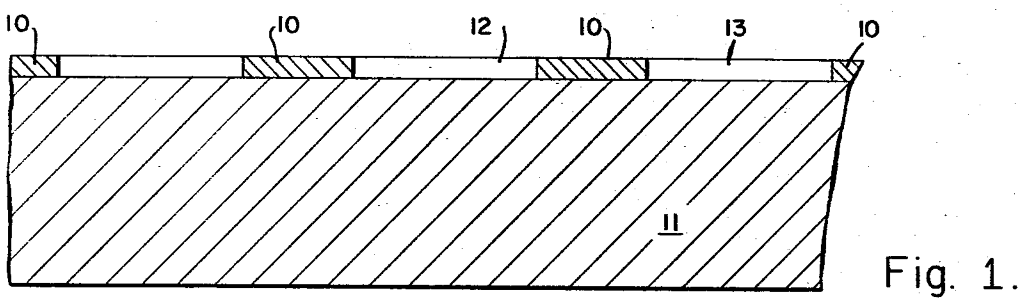
FIGS. 1 to 4 are schematic vertical sectional views representing fabrication steps showing a method for fabricating a mesa type metal-oxide-semiconductor field effect transistor of the invention.
Figure 2:
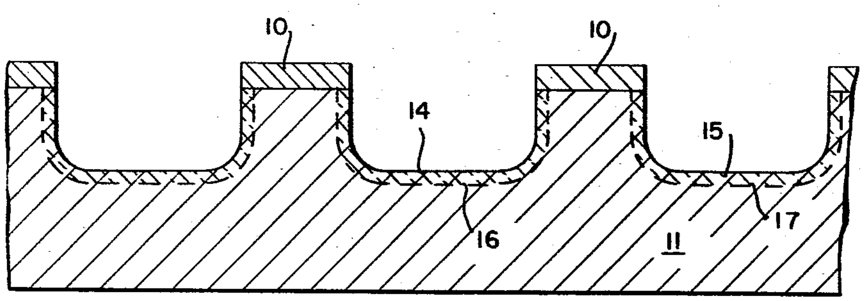
Figure 3:
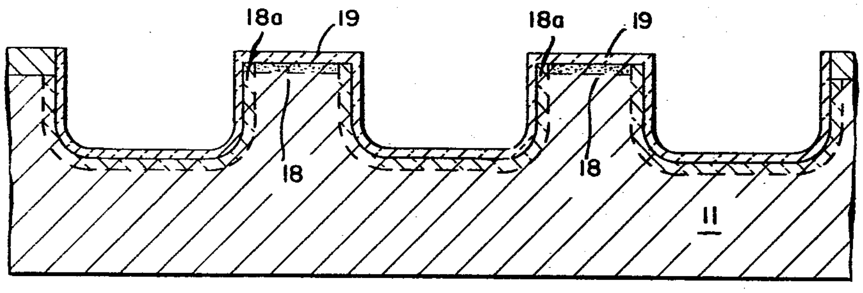
Figure 4:
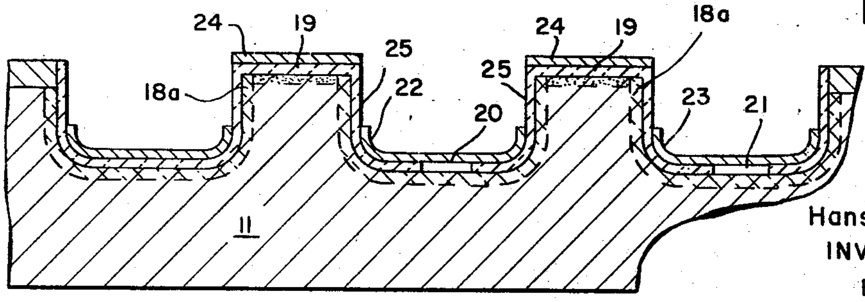

A one micron layer 10 of silicon dioxide is grown on a slice 11 of P-doped silicon. The drain region 12 and source region 13 are etched into the silicon dioxide layer 10 with the aid of a mask, as shown in FIG. 1. The silicon slice 11 then is etched to a depth of about eight microns, as shown in FIG. 2, to produce a drain 14 and a source 15. The N+ regions 16 and 17 are then diffused into the drain 14 and source 15 regions as shown in FIG. 2. The silicon dioxide layers 10 are then removed from the channel region 18 by etching through a suitable mask. A thin conducting N channel region 18$a$ is formed by diffusion. A thin silicon dioxide layer 19 of about 500 to 2,000 A. is then applied to slice 11 as shown in FIG. 3. Ohmic drain and source contacts 20 and 21 then are etched with the aid of a suitable mask as shown in FIG. 4. Finally, metal films 22 and 23 are deposited upon the drain and source areas, respectively, and metal films 24 are deposited on the gate areas from a source of metal vapor.

Figures 5, 6:
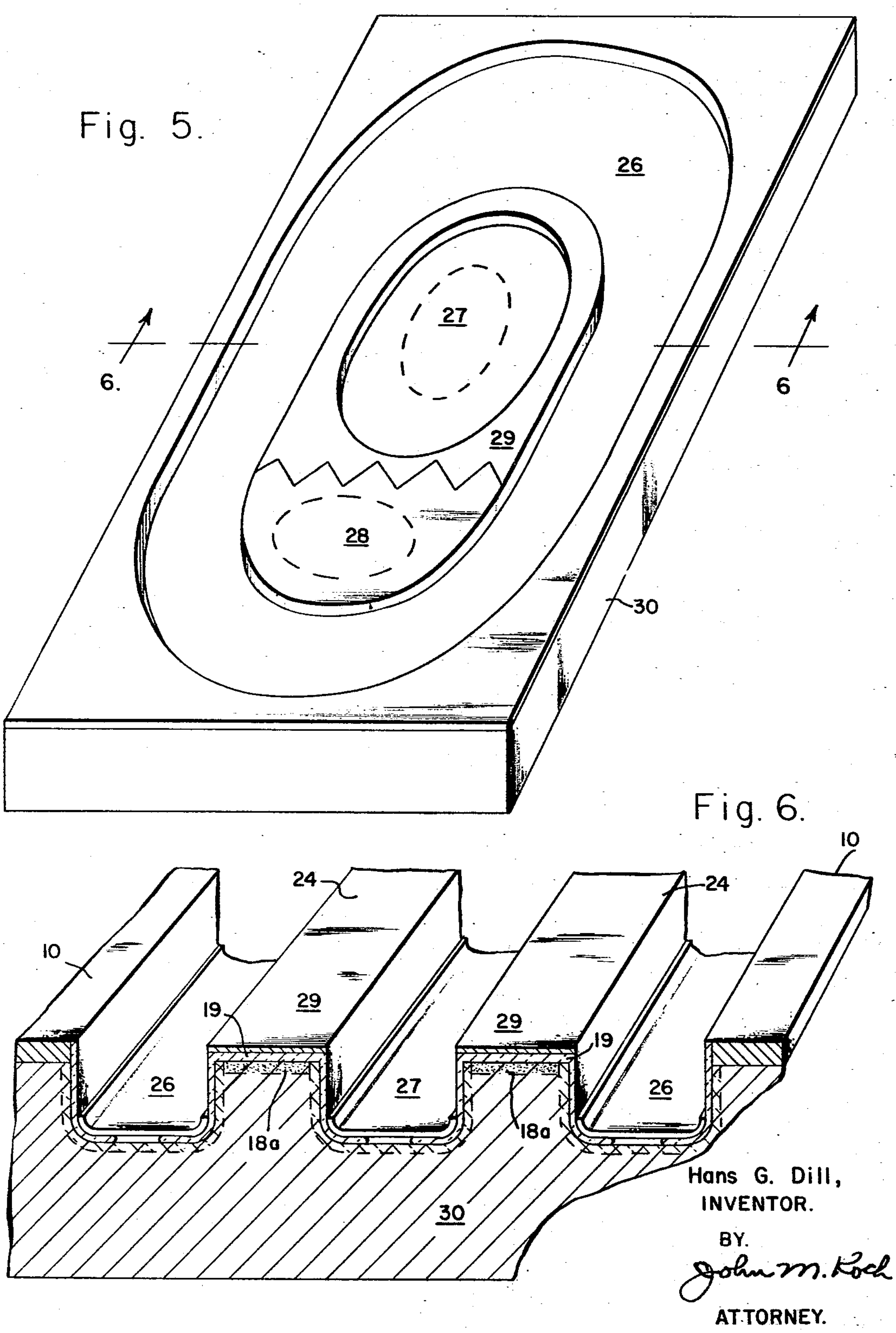
FIG. 5 is a schematic isometric view showing a fabricated mesa type metal-oxide-semiconductor field effect transistor of the invention.
FIG. 6 is a partial cross-sectional isometric view taken as along line 6—6 of FIG. 5 showing the relationship of source, drain and gate areas in a mesa type metal-oxide-semiconductor field effect transistor of the invention.

The full advantage of the mesa metal-oxide-semiconductor field effect transistor of the invention shown in FIG. 5 is realized by using an etched configuration including separate drain, source and gate electrodes formed by simple metal deposition without masking. The channel area stands as a mesa completely surrounded by the etched source and drain electrodes. Thus only three masking steps are needed and no close tolerance alignments are required. Of great importance is a well-controlled etching technique to create channel mesas with sharp vertical steps 25, and very little or no undercutting.

An embodiment of the metal-oxide-semiconductor field effect transistor of the invention, as shown in FIG. 5, is designed as an asymmetric configuration with the source region 26 grounded. For good high frequency performance it is important that the drain region 27 and gate region 28 electrodes have a small stray capacitance to the source (ground) and especially with respect to each other.

The gate contact area 28 is an enlarged channel. To keep the gate capacitance down, the original thick silicon dioxide layer ($1\mu$) is retained over the contact area, which should be as small as possible. Very little stray capacitance is added over the actual channel area 29 because the gate 28 overlaps the source 26 and drain 27 only by the diffusion depth, which is about $1\mu$. The entire drain area 27 is diffused and $C_{ds}$ is a function of the depletion region which depends primarily on the P substrate 30 resistivity and the reverse biasing drain potential $V_D$. A set of design constants selected for the mesa type metal-oxide-semiconductor field effect transistor of the invention are summarized in the table given below.

| | |
|---|---|
| Bias: | |
| Drain to source potential | $V_D=+5$ v. |
| Gate to source potential | $V_G=+2$ v. |
| P type Si substrate: | |
| Resistivity $\rho=5\Omega$ cm. | |
| N+ type drain and source diffusion: | |
| Diffusion depth | $1–2\mu$. |
| Sheet resistivity | $2–5\Omega/\square$. |
| Drain to substrate capacitance | 0.4 pf./mil$^2$. |
| Gate: | |
| $1\mu$ $SiO_2$ over contact area | 0.02 pf./mil$^2$. |
| $0.06\mu$ $SiO_2$ over channeal area | 0.35 pf./mil$^2$. |
| Al gate film, 1000 A. | $0.5\Omega/\square$. |
| N-channel mobility $\mu_N$ | 400 cm.$^2$/v. sec. |
| Etched drain and source depth | $7–9\mu$. |

The structure of the mesa type metal-oxide-semiconductor field effect transistor of the invention is based on the fact that a steep vertical step 25 (FIG. 4) separates vacuum deposited metal films such as 22 and 24 without the necessity of masking. Deposition of a continuous aluminum fill mover 1$\mu$ silicon dioxide step was a real difficult problem encountered in the prior art in the field of microelectronics. That very problem is turned into an advantage in the instant invention.

In accordance with the present invention, a mesa type metal-oxide-semiconductor field effect transistor is produced which is characterized by being a high frequency device with very low stray capacitance, although low-to-moderate power dissipation. The stray capacitance is minimized by placing the metal gate in the metal-oxide-semiconductor field effect transistor of the invention over the channel area in such a manner so that the source and drain overlap each other by the amount equal to the diffusion depth. This basic structure is shown in FIG. 5. It utilizes a vacuum deposited metal film separated by a vertical step. Among the principal differences involved in the metal-oxide-semiconductor field effect transistor of this invention, as compared with the conventional transistor of this type, are the fact that the source and drain regions are etched before the diffusion step is performed, and the metal film is evaporation-deposited from a distant point source under carefully directed conditions. By preventing objectionable thickness of the metal film from forming, the gate on the channel region is electrically separated from the source and from the drain.

In actual practice, it has been found that any undesirable, very thin metal bridge formation, that may form over the mesa steps of the field effect transistor of the invention, during its fabrication, is burned away by the flow of the slightest amount of electrical current when the fabricated transistor is activated. In other words, imperfections of the gate separations at the vertical step 25 (FIG. 4) in the thin metal bridge formation are self-repairing when the transistor is placed in service.

Among the advantages of the metal-oxide-semiconductor field effect transistor construction of this invention, as mentioned hereinabove, are low gate stray capacitances and low cost mass fabrication, although the device has a lower power dissipation because of the mesa construction. The full advantage of the mesa metal-oxide-semiconductor field effect transistor principle of this invention can be realized by using an etched configuration where separate drain, source and gate electrodes are formed by the use of a simple metal deposition step without the use of masking techniques. A configuration of this type of metal-oxide-semiconductor field effect transistor is shown in FIG. 5. The channel area 29 stands as a mesa completely surrounded by the etched source 26 and drain 27 electrodes of the configuration shown in FIG. 5.

It will be understood that, although a P silicon chip 11 or 30 with N+ source 26 and N+ drain 27 were used above in describing an embodiment of the metal-oxide-semiconductor field effect transistor of the invention, an N silicon chip with P+ source and P+ drain can be used. Also, instead of a silicon chip, a germanium chip, or chip of other suitable semiconductor material, can be used.

Obviously many other modifications and variations of the present invention are possible in the light of the above teachings. It is therefore to be understood that within the scope of the appended claims the invention can be practiced otherwise than as specifically described.

What is claimed is:

1. A metal oxide semiconductor field effect transistor which comprises:

a mesa region of a semiconductor substrate of a first conductivity type forming a channel area;

areas on opposite sides of the mesa region of second conductivity type forming respective source and drain areas;

an insulating film over the channel area; and a metal film forming a gate, insulated from the channel, source and drain areas by the insulating film, and overlying the channel area so that the source and drain areas are overlapped thereby substantially only to about the width of the source and drain areas.

2. A metal oxide semiconductor field effect transistor according to claim 1 and comprising:

a metal film ohmic contact connected to the source area and a metal film ohmic contact connected to the drain area.

3. A metal-oxide-semiconductor field effect transistor according to claim 2, wherein the source and drain areas comprise a portion perpendicular to the top of the mesa whereby the metal film gate area, the metal film source contact and the metal film drain contact may be vapor deposited simultaneously from a distant point source.

4. A metal-oxide-semiconductor field effect transistor according to claim 1, wherein the semiconductor material of the substrate, channel, source and drain is silicon.

5. A metal-oxide-semiconductor field effect transistor according to claim 1, wherein the semiconductor material of the substrate, channel, source and drain is germanium.

References Cited

UNITED STATES PATENTS

| | | | |
|---|---|---|---|
| 3,177,100 | 4/1965 | Mayer et al. | 317—235 |
| 3,206,670 | 9/1965 | Atalla | 317—235 |
| 3,223,904 | 12/1965 | Warner et al. | 317—235 |
| 3,241,931 | 3/1966 | Triggs et al. | 317—235 |

OTHER REFERENCES

Proceedings of the IEEE, The Silicon Insulated Gate Field Effect Transistor, by Hofstein and Heiman, September 1963 (pp. 1190 to 1202 relied upon).

JOHN W. HUCKERT, *Primary Examiner.*

R. F. POLISSACK, *Assistant Examiner.*